United States Patent [19]
Mizuno

[11] Patent Number: 5,634,105
[45] Date of Patent: May 27, 1997

[54] SEMICONDUCTOR MEMORY DEVICE TO INTERFACE CONTROL SIGNALS FOR A DRAM TO A SRAM

[75] Inventor: Kanji Mizuno, Tokyo, Japan

[73] Assignee: Mitsubishi Denki Kabushiki Kaisha, Tokyo, Japan

[21] Appl. No.: 278,332

[22] Filed: Jul. 21, 1994

[51] Int. Cl.$^6$ .................................................... G06F 12/00
[52] U.S. Cl. ................. 395/421.01; 395/431; 395/432; 365/230.02
[58] Field of Search ................................. 395/432, 438, 395/428, 421.01, 405; 365/230.02

[56] References Cited

U.S. PATENT DOCUMENTS 4,796,221  1/1989  Tokumitsu ..................... 395/421.01

*Primary Examiner*—Jack A. Lane
*Attorney, Agent, or Firm*—Oblon, Spivak, McClelland, Maier & Neustadt, P.C.

[57] ABSTRACT

In a semiconductor memory device in which row and column address signals are serially supplied using a multiplexer or serial address signals are supplied without using a multiplex, a RAM interface is provided which easily makes it possible to replace a DRAM with a SRAM. A memory IC which is formed by a DRAM is changed to a SRAM, and a resulting SRAM memory IC is controlled using a logic IC 10 which is originally constructed for use with the original DRAM memory IC. Between the logic IC and the SRAM memory IC, a RAM interface is disposed. According to the present invention, it is possible to divide row-column address signals which are supplied in serial form into row address signals and column address signals and to modify a control signal which controls a dynamic RAM to control a static RAM.

8 Claims, 19 Drawing Sheets

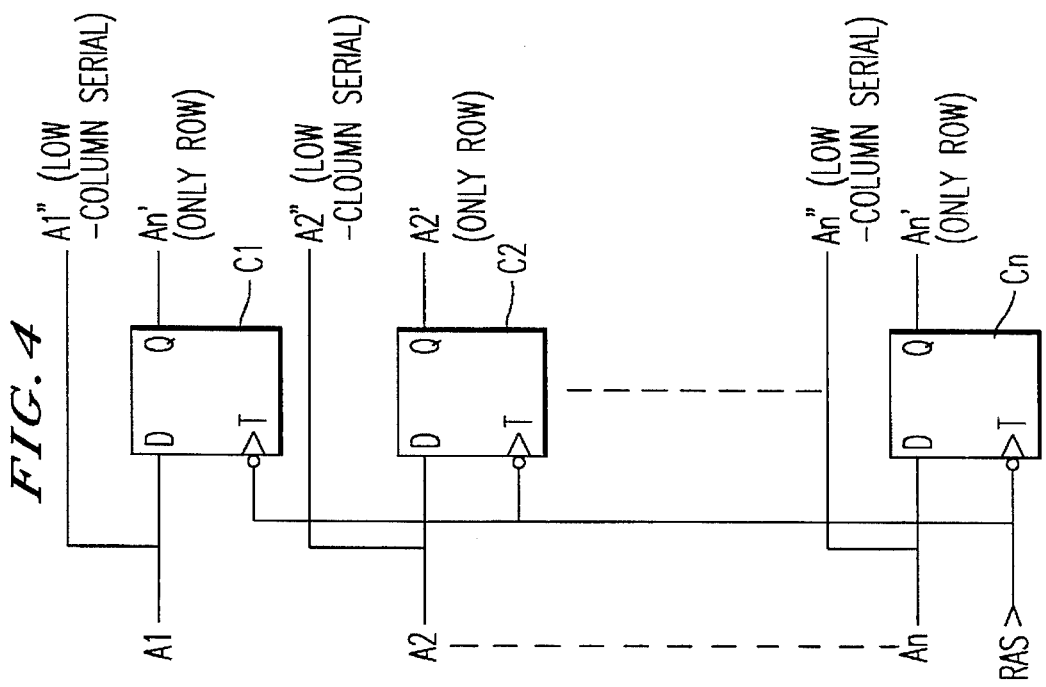
FIG. 4
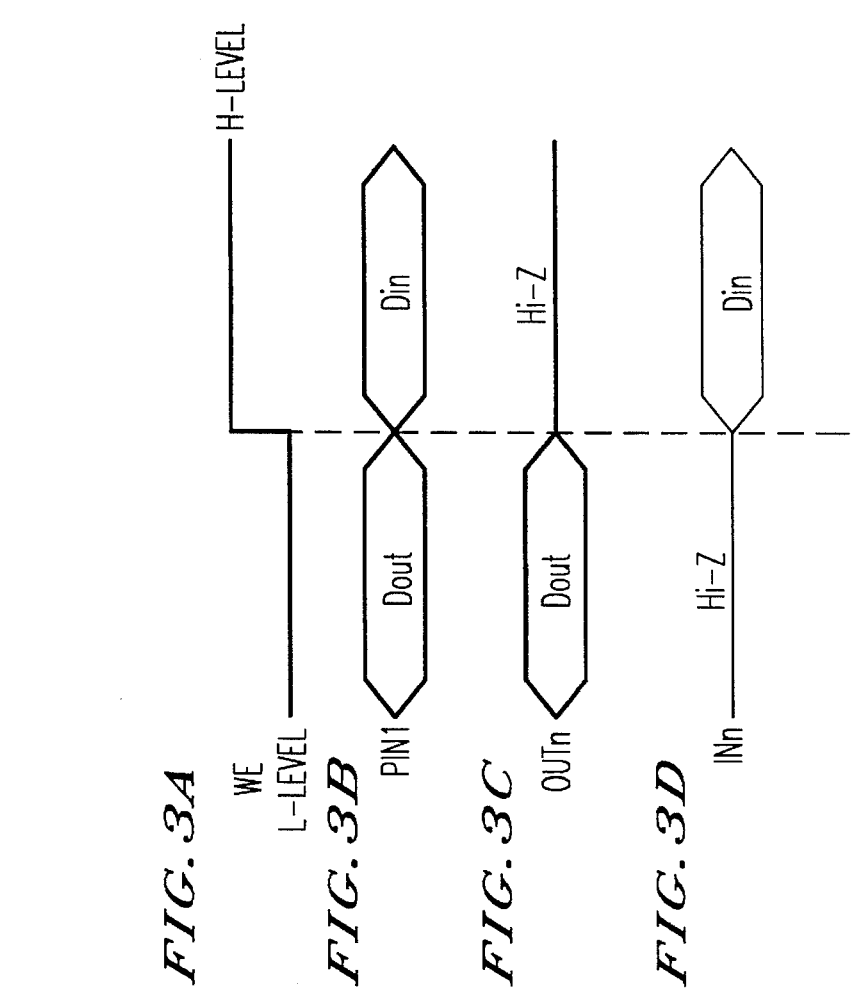
FIG. 3A
FIG. 3B
FIG. 3C
FIG. 3D

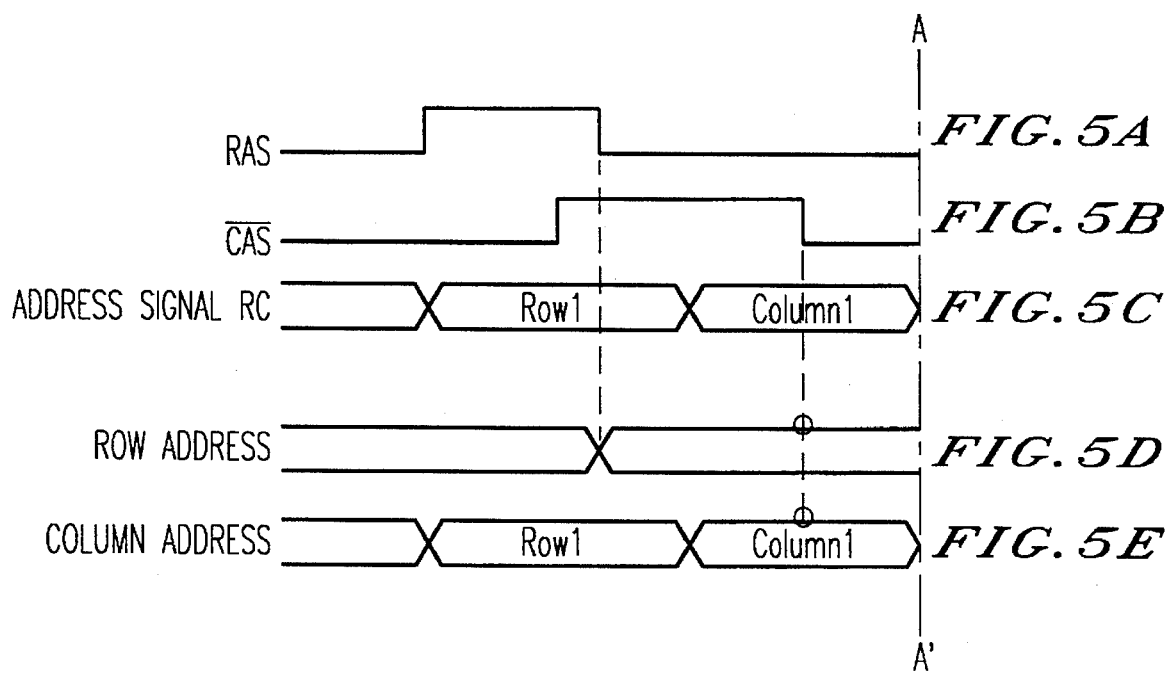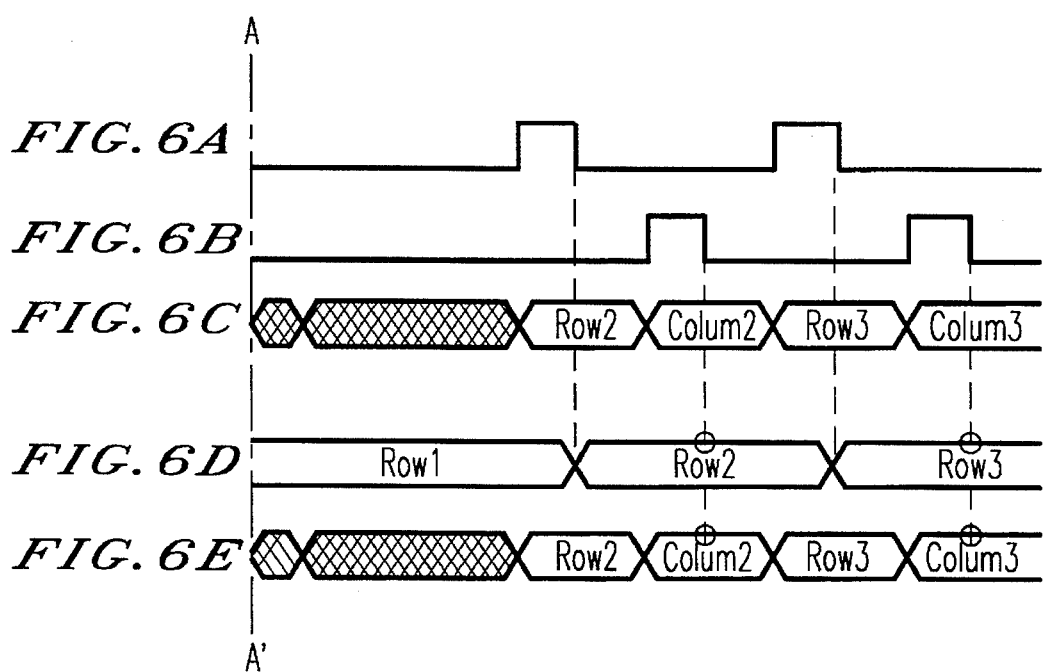

FIG. 7
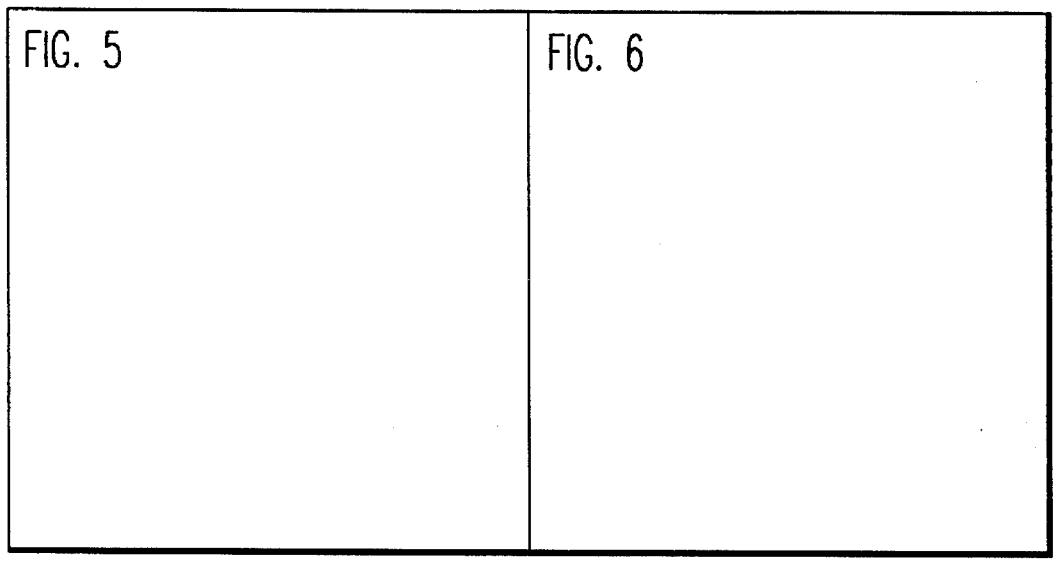
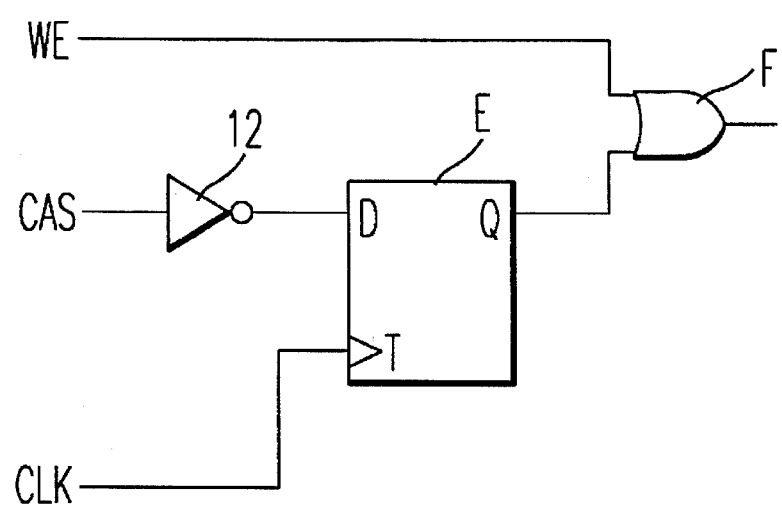
FIG. 8

FIG. 11
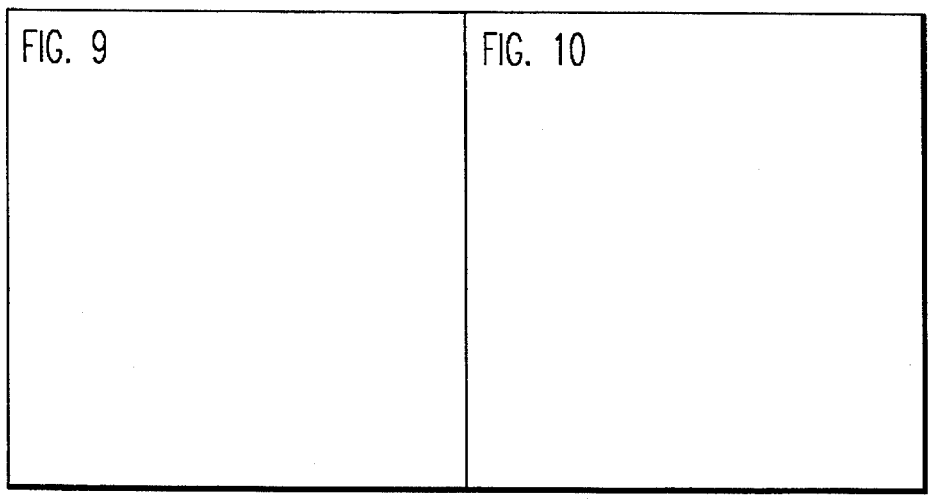
| FIG. 9 | FIG. 10 |
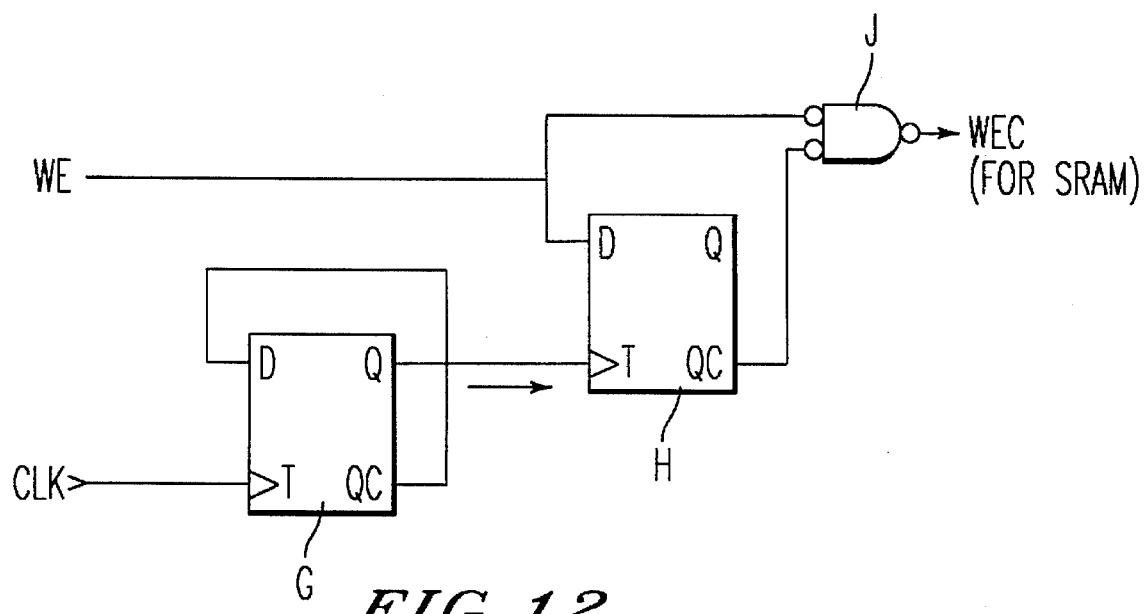
FIG. 12

FIG. 15
| FIG. 13 | FIG. 14 |
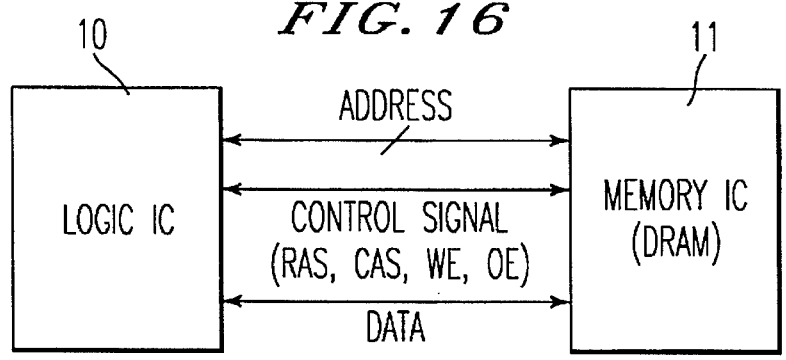
FIG. 16
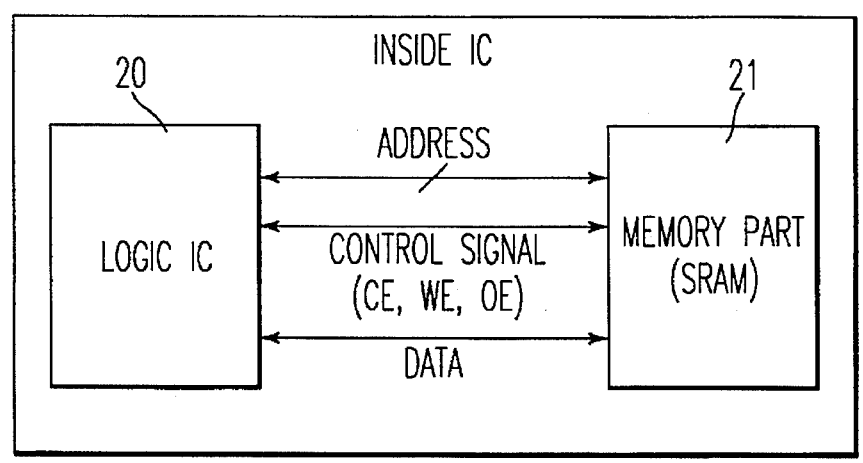
FIG. 17

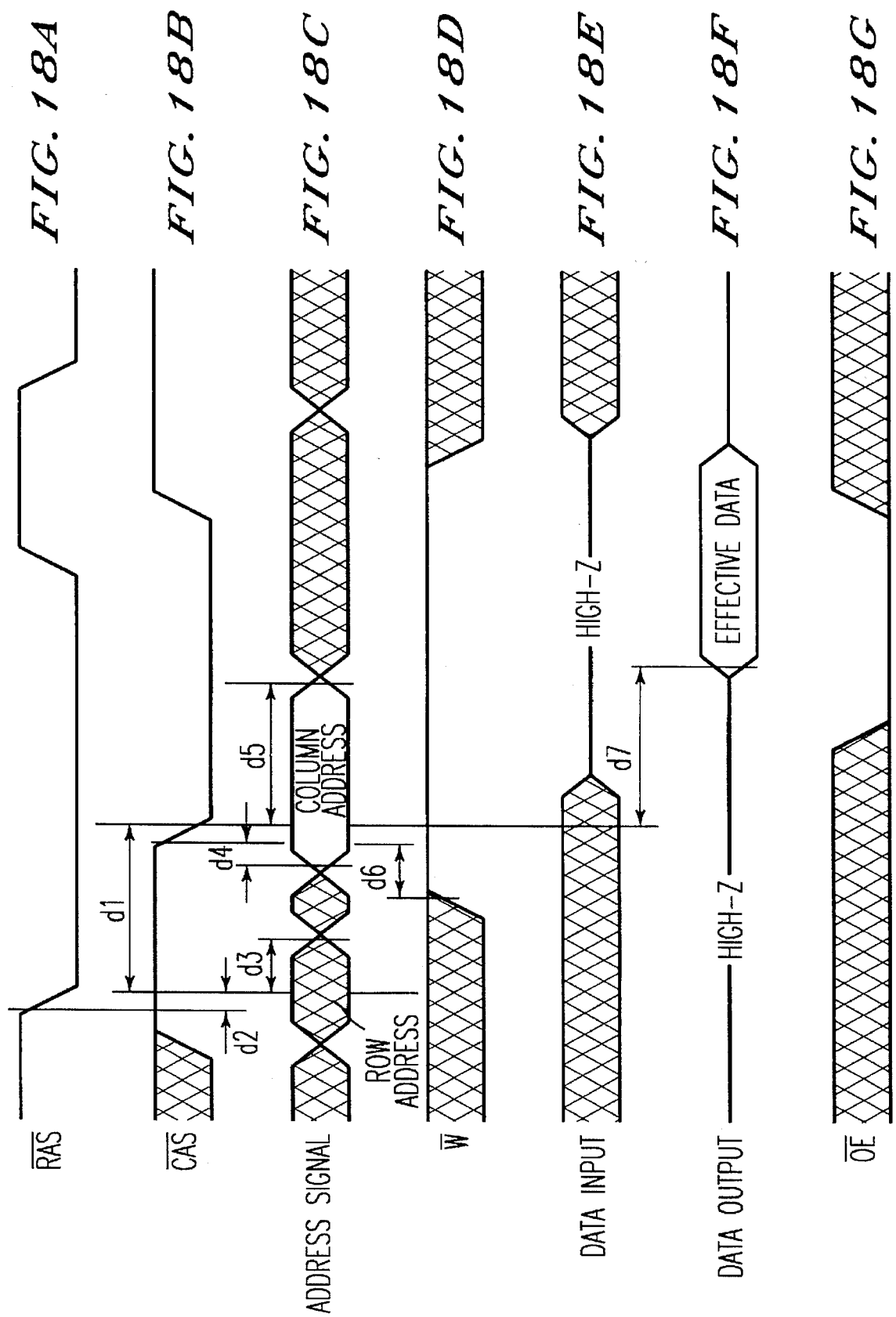

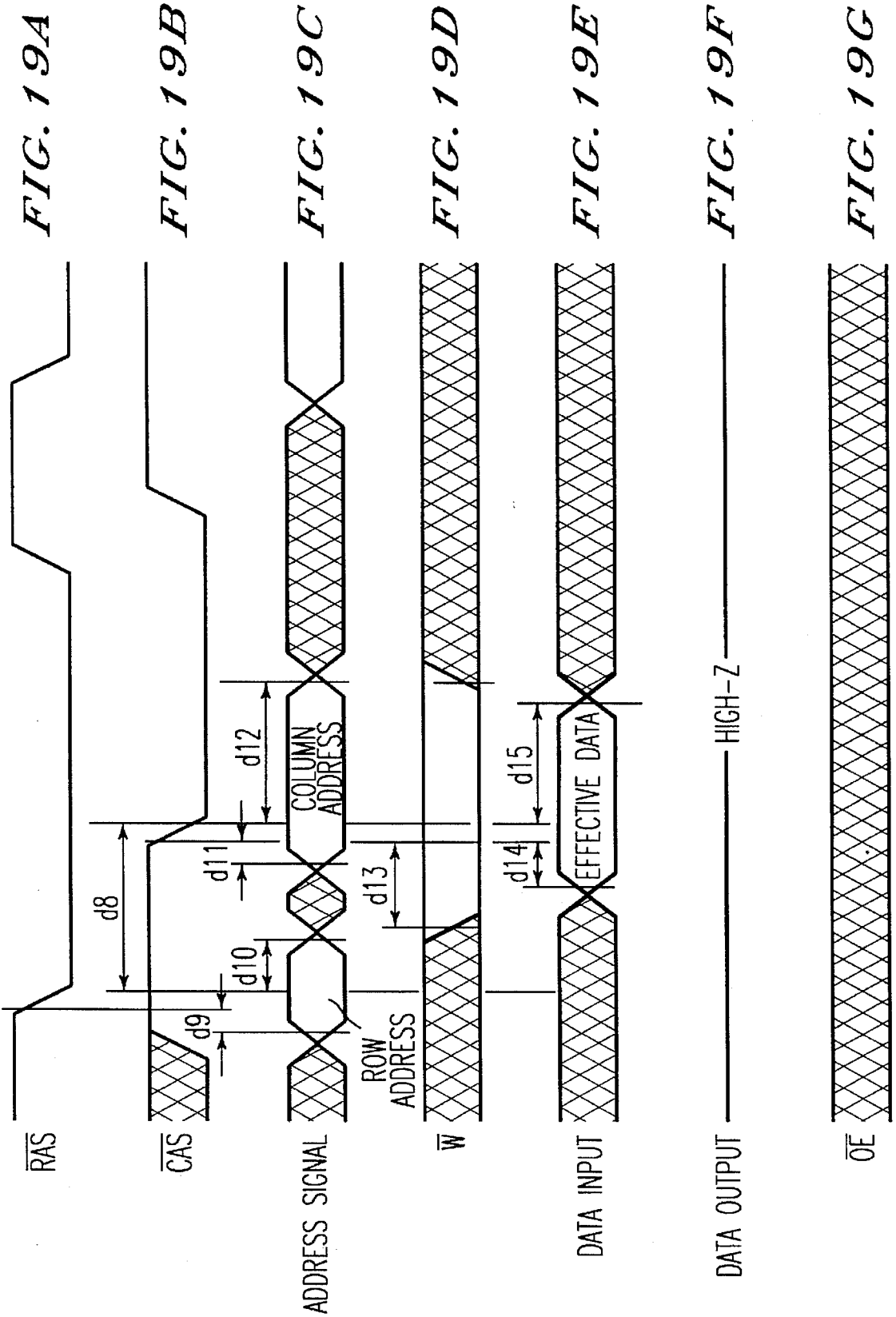

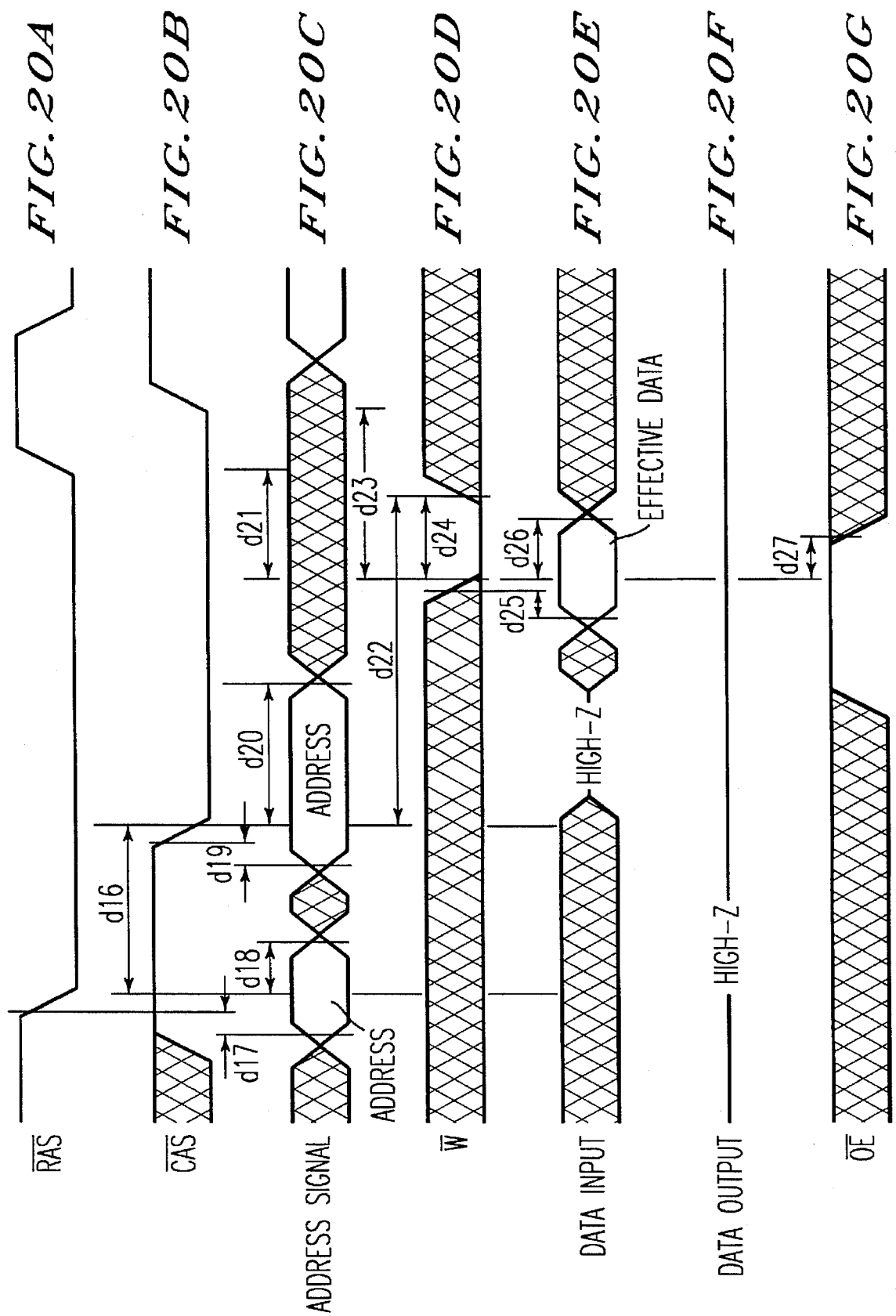

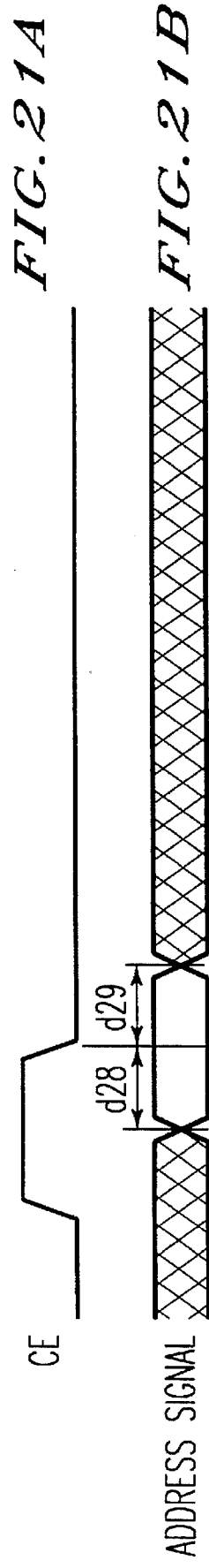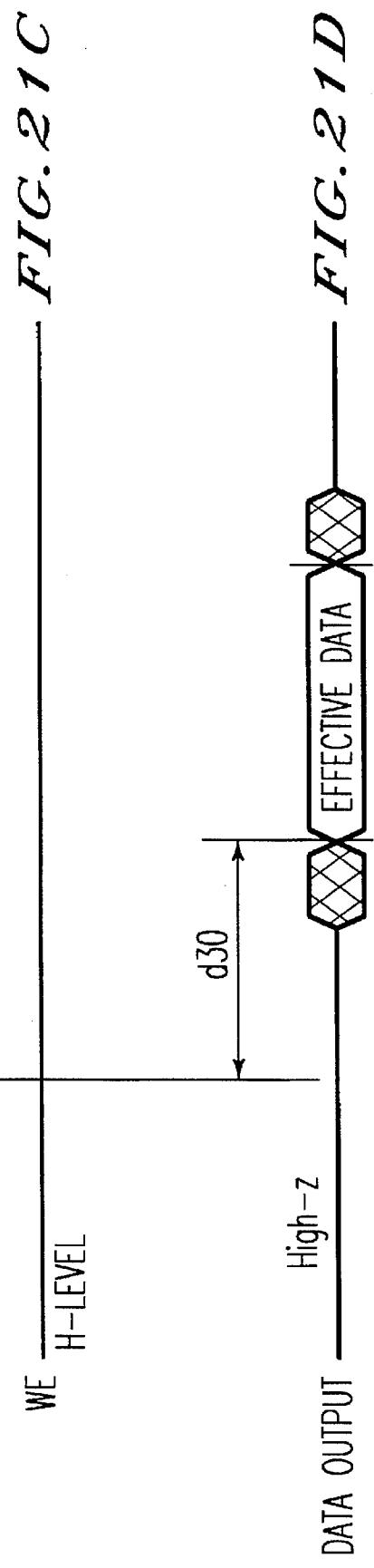

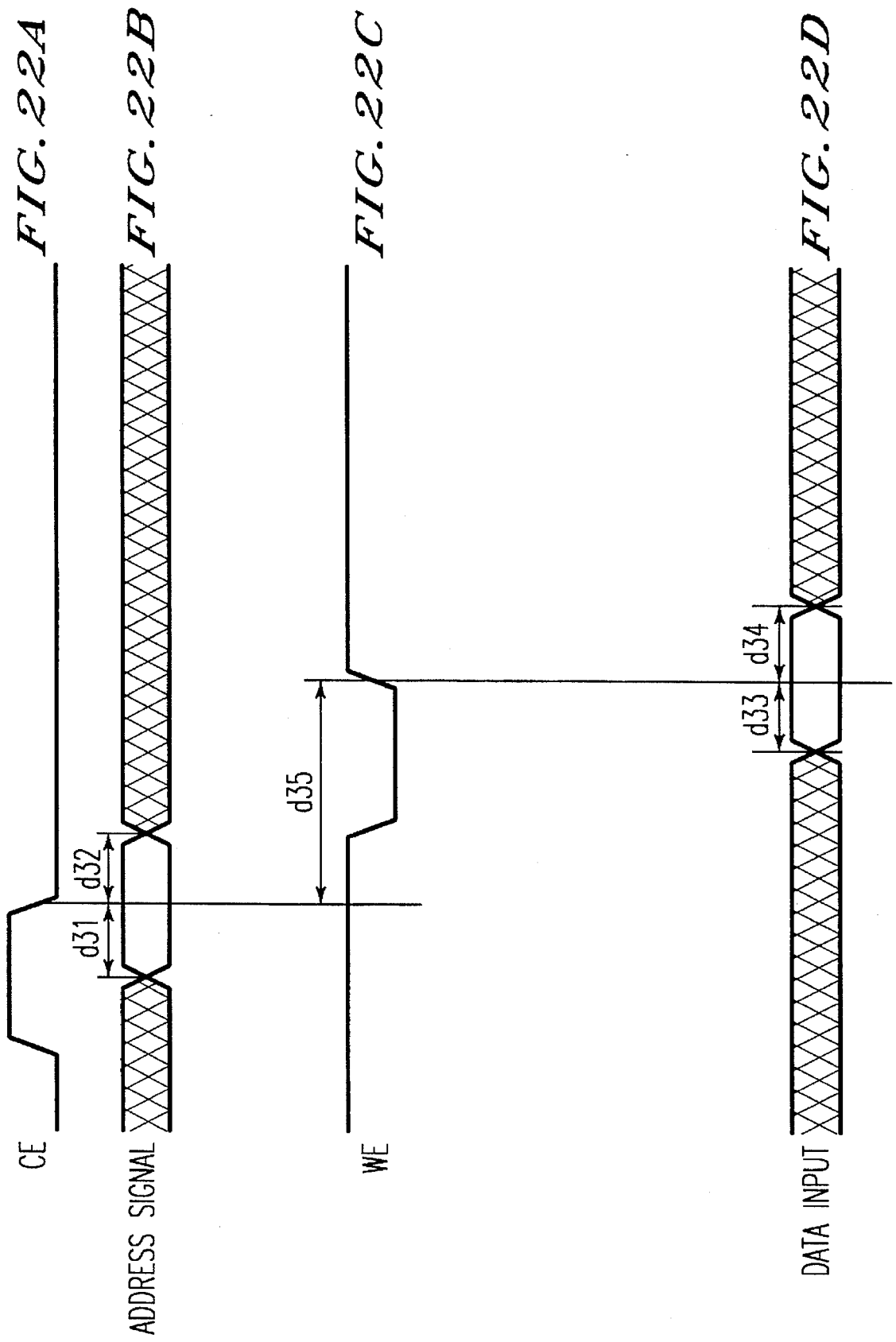

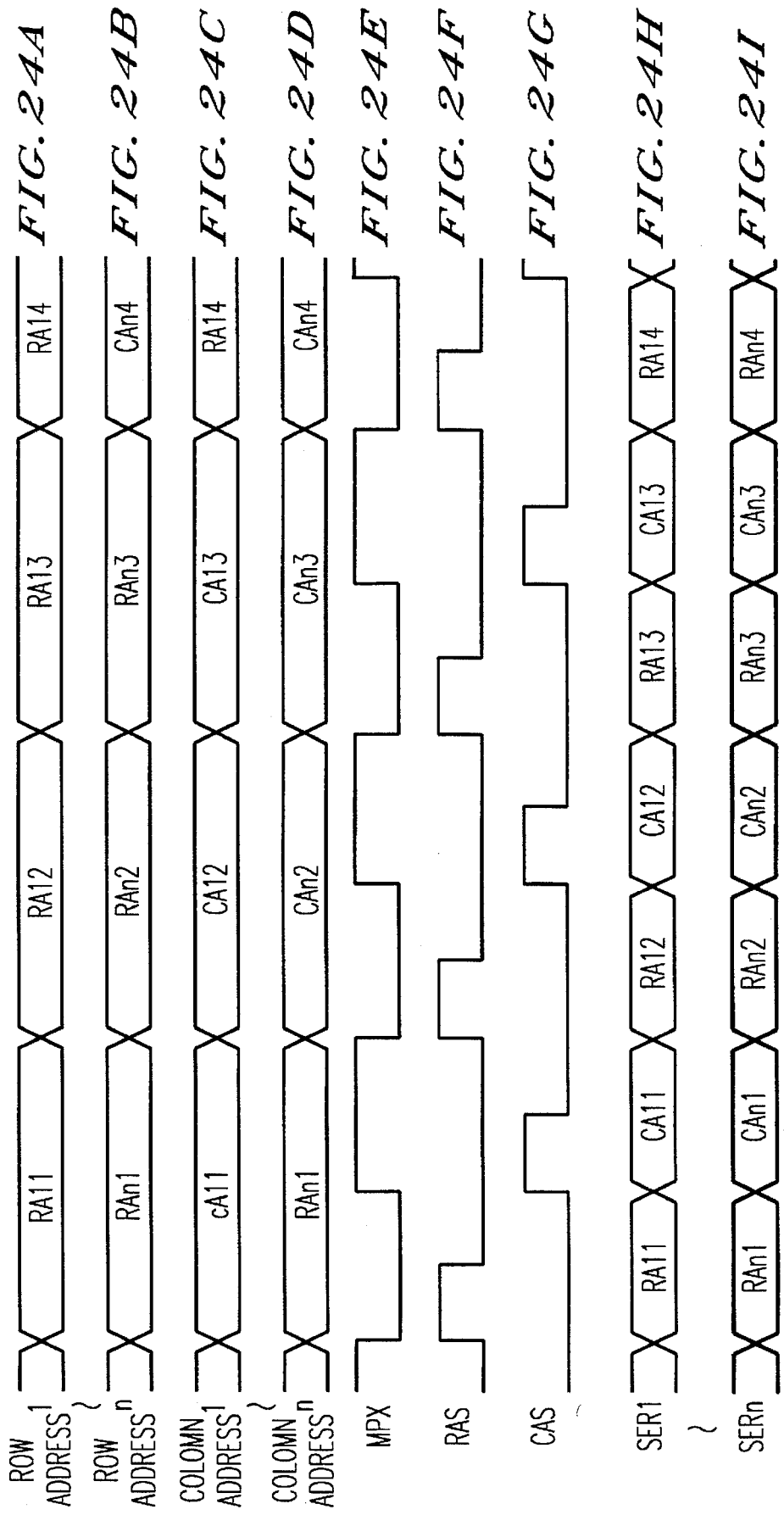

SEMICONDUCTOR MEMORY DEVICE TO INTERFACE CONTROL SIGNALS FOR A DRAM TO A SRAM

BACKGROUND OF THE INVENTION

1. Field of the Invention

The present invention relates to a semiconductor memory device in which a dynamic RAM control device supplies a controls signal which control a dynamic RAM, and more particularly, to a semiconductor memory device in which a dynamic RAM control device controls a static RAM.

2. Description of the Background Art

A RAM (Random Access Memory) is an IC memory which is capable of designating a certain area of a memory and freely reading and writing data at the designated area. RAMs are divided into DRAMs (Dynamic RAM), SRAMs (Static RAM) and other RAMs according to their structures. Usually, a semiconductor memory device is fabricated incorporating a DRAM or an SRAM depending on a need. However, in some cases, an already completed semiconductor memory device needs be modified at a user's request or for some other reason. To explain this, a semiconductor memory device which is comprised of a memory IC and a logic IC which controls the memory IC is taken as an example. If the two ICs are to be fabricated independently of each other, a DRAM is a usual choice for the memory IC since use of a DRAM will reduce the overall size of the package. Let us assume here that an SRAM is to be used as the memory IC instead of a DRAM and both the logic IC and the memory IC are to be formed on the same semiconductor chip in order to further reduce the size of the package but without changing the structure of the logic IC (See FIGS. 16 to 18). Such a modification is sometimes demanded in the industry.

FIG 16 is a view showing a structure of the semiconductor memory device in which the memory IC is formed by a DRAM. As can be seen in FIG. 16, the logic IC 10 and the memory IC 11 are independently formed. In FIG. 16, an address signal and a control signal are supplied from the logic IC 10 to the memory IC 11, thereby transferring a data signal between the logic IC 10 and the memory IC 11.

In general, if a logic IC and a memory IC are to be formed on the same semiconductor substrate (i.e., if the two ICs are to be formed in "one chip"), an SRAM is used as the memory IC considering the efficiency of manufacturing processes. FIG. 17 is a view of a semiconductor memory device 100 in which a logic part 20 and a memory part 21 which uses an SRAM are formed on the same semiconductor substrate. In the structure of FIG. 17 as well, it is within the semiconductor memory device 100 that an address signal and a control signal are supplied from the logic part 20 to the memory part 21 and a data signal is consequently transferred between the logic part 20 and the memory part 21.

Thus, it the semiconductor memory device in which the logic IC 10 and the memory IC 11 which uses a DRAM are formed independently of each other is to be completed as one chip as shown in FIG. 16, the memory IC 11 has to be changed to an SRAM. However, since the logic IC 10 is designed on a premise that the memory IC 11 is a DRAM, it is necessary not only to change the memory IC 11 from a DRAM to an SRAM but also to accordingly change a RAM interface of the logic IC 10 in compliance with the change from a DRAM to an SRAM.

Here arises a problem associated with the change of the RAM interface of the logic IC 10, which is designed for a DRAM, to an interface for an SRAM. That is, there is a difference between a DRAM and an SRAM with respect to addressing. In the following, typical addressing methods for a DRAM and an SRAM will be described.

As mentioned earlier, in the case of a DRAM, a row address and a column address are serially transferred to reduce the number of address bus lines so that the size of the package will be suppressed. To discriminate a row address from a column address within the memory as shown in FIG. 16, a row address strobe signal (hereinafter "RAS signal") and a column address strobe signal (hereinafter "CAS signal") are used as control signals and transferred in parallel form. Other necessary control signals are a write enable signal (hereinafter "We signal") which instructs writing and reading of data and an output enable signal (hereinafter "OE signal") which decides a data output of which memory IC is to be selected when the memory IC shares the data line with other memory IC. The WE signal is usually at a low level when instructing writing of data and at a high level when instructing reading of data.

1. Read Cycle of DRAM

A read cycle of a DRAM will be described with reference to FIG. 18, which is a timing chart which shows a read cycle of a regular DRAM. In FIG. 18, the read cycle starts at a fall of the RAS signal. After a time d1 upon the fall of the RAS signal, the CAS signal completes falling. The time d1 is a minimum necessary interval between the low-level RAS signal and the low-level CAS signal. There is no possibility that the RAS signal will come after the CAS signal. A time d2 is a set up time for the row address signal. The row address signal is supplied the time d2 ahead of the RAS signal. In other words, the row address must be determined the time d2 ahead of the RAS signal. For a time d3 after the fall of the RAS signal, the row address signal must hold the same data.

On the other hand, the column address signal is supplied a time d4 ahead of the CAS signal. This means that the column address must be determined the time d4 ahead of the CAS signal. For a time d5 after the fall of the CAS signal, the column address signal must hold the same data.

It is necessary that the WE signal completes transition to the high level a time d6 ahead of the CAS signal. A time d7 is a time from the fall of the CAS signal to outputting of effective data. In general, d1+d7 is the access time of the DRAM.

As described above, during the read cycle, the RAS signal and the CAS signal latch the low address signal and the column address signal, respectively. After the time d7 from the latching, data stored at the addresses which are designed by the low address signal and the column address signal is outputted.

2. Write Cycle of DRAM

Now, a write cycle will be described. Since an early write cycle and a delayed write cycle are major write cycles, only these two typical write cycles will be described below.

2-1. Early Write Cycle

FIG. 19 is a timing chart showing an early write cycle of a regular DRAM. The early write cycle is characterized in that the trailing edge of the WE signal comes earlier than the trailing edge of the CAS signal.

An early write cycle starts at a fall of the RAS signal. After a time d8 upon fall of the RAS signal, the CAS signal completes falling. The time is d8 a minimum necessary interval between the low-level RAS signal and the low-level CAS signal. There is no possibility that the RAS signal will come after the CAS signal.

A time d9 is a set up time for the row address signal. The row address signal is supplied the time d9 ahead of the RAS signal. In other words, the row address must be determined the time d9 ahead of the RAS signal. For a time d10 after the fall of the RAS signal, the row address signal must hold the same data.

On the other hand, the column address signal is supplied a time d11 ahead of the CAS signal. This means that the column address must be designated the time d11 ahead of the CAS signal. For a time d12 after the fall of the CAS signal, the column address signal must hold the same data.

It is necessary that WE signal completes transition to the low level a time d13 ahead of the CAS signal. With the WE signal fixed at the low level, inputting of effective data starts a time d14 ahead of the CAS signal. Inputting of the effective data continues for a time d15 after the fall of the CAS signal.

Thus, in the early write cycle, the RAS signal and the CAS signal latch the low address signal and the column address signal, respectively, to designate the address. The WE signal falls to the low level before the trailing edge of the CAS signal, and the trailing edge of the CAS signal which is supplied during the low-level period of the WE signal is used as a latch signal for data which is to be written.

2-2. Delayed Write Cycle

FIG. 20 is a timing chart showing a delayed write cycle of a regular DRAM. A delayed write cycle is characterized in that the trailing edge of the CAS signal comes ahead of the trailing edge of the WE signal.

A delayed write starts at a fall of the RAS signal. After a time d16 upon fall of the RAS signal, the CAS signal completes falling. The time is d16 a minimum necessary interval between the low-level RAS signal and the low-level CAS signal. There is no possibility that the RAS signal will come after the CAS signal.

A time d17 is a set up time for the row address signal. The row address signal is supplied the time d17 ahead of the RAS signal. In other words, the row address must be designated the time d17 ahead of the RAS signal. For a time d18 after the fall of the RAS signal, the row address signal must hold the same data.

On the other head, the column address signal is supplied a time d19 ahead of the CAS signal. This means that the column address must be designated the time d19 ahead of the CAS signal. For a time d20 after the fall of the CAS signal, the column address signal must hold the same data.

A time between the fall of the WE signal to the rise of the next RAS signal is a hold time of the RAS signal, i.e., a time d21. A time between the fall of the WE signal to the rise of the next CAS signal is a hold time of the CAS signal, or a time d23.

A time between the fall of the CAS signal to the rise of the next WE signal is a hold time of a write instruction, i.e., a time d22.

A time between the fall of the WE signal to the rise of the next WE signal is a hold time of a write instruction, i.e., a time d24.

Inputting of effective data starts a time d25 ahead of the WE signal. For a time d26 upon the fall of the WE signal, inputting of the effective data must continue. A time from the fall of the WE signal to the next OE signal is a hold time of the output enable signal after writing, that is, a time d27.

Thus, during a delayed write cycle, although the addressing method for designating the row and the column addresses is the same as that for an early write cycle in that the RAS signal and the CAS signal are used to designate the addresses, one difference is that the trailing edge of the WE signal which comes behind the trailing edge of the CAS signal is used as a latch signal for data which is to be written.

3. Read Cycle of SRAM

Next, a read timing and a write timing in a regular synchronous SRAM will be described. FIG. 21 shows a read timing. In FIG. 21, an address signal is supplied a time d28 ahead of a fall of a chip enable signal (hereinafter "CE signal"). The address signal should remain effective for a time d29 after the fall of the CE signal. That is, the address signal is supplied during the time d28 and the time d29 as the CE signal falls. A time d30 is a delay time from latching of the address signal to outputting of a data signal.

Thus in a read cycle of the SRAM, the WE signal is always at the high level, the address signal is latched by a fall of the CE signal, and data held at the address which is designated by the address signal is outputted after a delay of the time d30.

4. Write Cycle of SRAM

FIG. 22 shows a write timing. In FIG. 22, an address signal is supplied a time d31 ahead of a fall of the CE signal. The address signal should remain effective for a time d32 after the fall of the CE signal. In other words, the address signal is supplied during the time d31 and the time d32 as the CE signal falls. The WE signal rises after the time d35 from the fall of the CE signal. A time d35 is a minimum necessary interval between the CE signal and the WE signal.

A data signal is inputted a time d33 ahead of a rise of the WE signal. The data signal must remain effective for a time d34 after the rise of the WE signal. In short, the data signal is supplied during the time d33 and the time d34 as the WE signal rises.

Thus, writing of data in the synchronous SRAM starts at a rise of the WE signal. The trailing edge of the CE signal comes prior to the rising edge of the WE signal, whereby desired data is written at a designated address.

As described above, an SRAM and a DRAM designated an address and latch data to be written in a different manner. A major difference between an SRAM and a DRAM to be particularly noted is that a row address and a column address are serially transferred in a DRAM.

5. Means for Serially Supplying Addresses Using Multiplexer

To use a multiplexer is one of the options for supplying a row address and a column address in serial form. In the following, an address multiplexing method for a DRAM will be described with reference to FIGS. 23 and 24.

FIG. 23 is a block diagram showing a multiplexer 3 and a structure surrounding the same. In FIG. 23, the multiplexer 3 is connected to a signal generation circuit 1 which generates the RAS, the CAS and the WE signals, which are to be supplied to the DRAM, when a read, a write and a clock signals are respectively received, and to an RFSH signal which determines a refresh timing. The multiplexer 3 is also connected to an external system 2 which transmits the row address signal and the column address signal in parallel form. As herein termed, the external system 2 refers to a micro computer, a logic IC or etc.

From the external system 2, the row address signal and the column address signal are fed in parallel form to the multiplexer 3 where they are converted into serial form. The signal generation circuit 1 supplies an MPX signal which switches outputs of the multiplexer 3 as described later. Since the signal generation circuit 1 is not much relevant to an explanation of the address multiplexing method, the signal generation circuit 1 will not be described in detail with respect to its structure and other features.

The multiplexer 3 is a selector as far as its function is concerned. The multiplexer 3 is comprised of n switching circuits SC1 to SCn (N=1–8). The switching circuits SC1 to SCn each have two input terminals (1A,1B) ... (nA,nB). Row address signals RAnm (n=1-8, m=1,2,...) are fed to the input terminals 1A to nA from the external system 2 while column address signals CAnm (n=1-8; m=1, 2, ...) are fed to the input terminals 1B to nB. The switching circuits SC1 to SCn also respectively have output terminals 1Y and nY from which output signals SER1 to SERn are respectively outputted. Further, the switching circuits SC1 to SCn each have a selector switch S to receive the MPX signal from the signal generation circuit 1.

Basically, in the multiplexer 3, signals received at the input terminals 1B to nB are allowed to the output terminals 1Y to nY when a low level signal is received by the selector switches S. When a high level signal is fed to the selector switch S, signals received at the input terminals 1A to nA are allowed to the output terminals 1Y to nY.

FIG. 24 is a timing chart illustrating a case where parallel data transmitted from the external system 2 is converted into serial data by the multiplexer 3. In FIG. 24, when the MPX signal which is to be supplied to the selector switch S from the signal generation circuit 1 is at the low level, the row address signals RAnm (n=1-8, m=1, 2, ...) are inputted as the output signals SER1 to SERn. On the other hand, it the MPX signal which is at the high level, the column address signals CAnm (n=1-8, m=1, 2, ...) are outputted as the output signals SER1 to SERn. Thus, the MPX signal is switched alternately between the high level and the low level, whereby the row address and the column address signals are serially outputted.

Where a row address and a column address signals are converted into serial form by a multiplexer in this manner, it is possible to supply address signals in parallel form by simply removing the multiplexer, and therefore, it is possible to modify a RAM interface from a DRAM interface structure to an SRAM interface structure. However, some semiconductor memory devices do not comprise a multiplexer from the beginning.

6. Other Means Serially Supplying Addresses

FIG. 25 shows other means for serially supplying addresses without using a multiplexer. In FIG. 25, a counter circuit 40 is connected before a logic IC 50. The counter circuit 40 frequency-divides a clock signal once to three times into outputs Q1 to Q3. The outputs Q1 to Q3 are outputted through the logic IC 50 as the RAS and the CA signals. The counter circuit 40 also outputs and output Q4 from its inner flip-flop circuit as a serial address. The timing chart of FIG. 25 shows timings at which the row address and the column address of the output Q4 are latched by the RAS signal and the CAS signal.

In some other cases where a serial address is directly supplied from a micro computer to a DRAM, it is very difficult to convert address signals into parallel form.

As heretofore described, in a semiconductor memory device which is comprises of a memory IC and a logic IC which controls the memory IC, it is sometimes necessary to change the memory IC from a DRAM to an SRAM. It a row address signal and a column address signal are supplied in serial form using a multiplexer, the address signals can be supplied in parallel form instead of serial form by removing the multiplexer. In this case, however, not only removal of the multiplexer but also time-consuming verification of operations of the logic IC are necessary as well.

In addition, the inner structure of the logic IC must be modified to deal with a difference between a DRAM and an SRAM with respect to timings of control signals, which is not easy.

SUMMARY OF THE INVENTION

The present invention is directed to a semiconductor memory device, comprising: a dynamic RAM control device for generating a control signal which controls a dynamic RAM; and a RAM interface provided in an output side of the dynamic RAM control device, the RAM interface comprising: an address signal dividing means for dividing a serial row-column address signal from the dynamic RAM control device into a row address signal and a column address signal, and a static RAM control signal generating means for receiving the control signal to generate a control signal which controls a static RAM.

Preferably, the RAM interface further comprises bi-directional switching means which control inputting and outputting of a data signal for each data bus line in accordance with writing and reading of data.

Further, the bi-directional switching means may include a first and second tri-state buffers which operate in response to a WE signal which instructs to write data in or read data from a dynamic RAM. The first tri-state buffer is activated for writing of data but stays at a high impedance state when data is to be read, and the second tri-state buffer is activated for reading of data but stays at a high impedance state when data is to be written.

Alternatively, the address signal dividing means includes address signal latching means, the number of the address signal latching means being the same as the number of address lines. The address signal latching means receive the serial row-column address signal and an RAS signal which instructs to fetch a row address signal, latch and output the row address signal at a timing of the RAS signal while simultaneously outputting the serial row-column address signal as it presently is.

Preferably, the address signal latching means each include a D-type latch.

Alternatively, the static RAM control signal generating means includes a WEC sinal generating means which generates a WEC signal which instructs to start writing of data. The WEC signal generating means includes CAS signal latching means, the CAS signal latching means receives an inverted signal of a CAS signal which instructs to fetch a column address signal and a clock signal which is supplied at prescribed intervals, the CAS signal latching means then delays the CAS signal on the basis of a timing of the clock signal and outputs it as an inverted delay CAS signal. The WEC signal generating means also includes an OR circuit, the OR circuit receives a WE signal which instructs to read data and the inverted delay CAS signal and then outputs a signal which is generated by OR operations as the WEC signal.

Preferably, the CAS signal latching means includes a D-type latch.

Alternatively, the static RAM control signal generating means includes a WEC sinal generating means which generates a WEC signal which instructs to start writing of data. The WEC signal generating means includes clock frequency-dividing means which frequency-divides a clock signal which is supplied at regular intervals, and output a frequency-divided clock signal. The WEC signal generating means also includes WE signal latching means, the WE signal latching means receives a WE signal which instructs to read data and the frequency-divided clock signal, the WE signal latching means then delays the WE signal for a predetermined delay time on the basis of a timing of the frequency-divided clock signal and outputs its as an inverted WE delay signal. The WEC signal generating means also includes an OR circuit, the OR circuit receives the inverted WE delay signal and the WE signal and outputs a signal which is generate by OR operations as the WEC signal.

Alternatively, the WE signal latching means and the clock frequency-dividing means each include a D-type latch.

Thus, the RAM interface includes the address signal dividing means and the static RAM control signal generating means. Hence, it is possible to convert the control signal which instructs to divide the serial row-column address signal into the row address signal and the column address signal and to control the dynamic RAM into another type of control signal which controls the static RAM.

Accordingly, it is an object of the present invention to offer a RAM interface which allows an easy replacement of a DRAM with an SRAM in a semiconductor memory device in which a row address and a column address signals are supplied in serial form using a multiplexer or in which a serial address is supplied without using a multiplexer.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a timing chart showing operations of the bi-directional switch circuit of the semiconductor memory device according to the present invention;

FIG. 4 is a view showing a structure of a row-column address dividing circuit of the semiconductor memory device according to the present invention;

FIGS 5 and 6 are divided timing charts showing operations of the row-column address dividing circuit of the semiconductor memory device according to the present invention;

FIG. 7 is a view showing a structure of FIGS. 5 and 6;

FIG. 8 is a view showing a structure of an SRAM control signal generation circuit for an early write cycle which is used in the semiconductor memory device according to the present invention;

FIG. 11 is a view showing a structure of FIGS. 9 and 10;

FIG. 12 is a view showing a structure of an SRAM control signal generation circuit for a delayed write cycle which is used in the semiconductor memory device according to the present invention;

FIG. 15 is a view showing a structure of FIGS. 13 and 14;

FIG. 16 is a block diagram showing a structure of a semiconductor memory device which uses a DRAM as a memory IC;

FIG. 17 is a block diagram showing a structure of a semiconductor memory device which uses an SRAM as a memory IC;

FIG. 18 is a timing chart showing a read cycle of a DRAM;

FIG. 19 is a timing chart showing an early write cycle of a DRAM;

FIG. 20 is a timing chart showing a delayed write cycle of a DRAM;

FIG. 21 is a timing chart showing a read cycle of an SRAM;

FIG. 22 is a timing chart showing a write cycle of an SRAM;

FIG. 24 is a timing chart showing operations of the multiplexer for an address signal.

DESCRIPTION OF THE PREFERRED EMBODIMENTS

Figure 1:
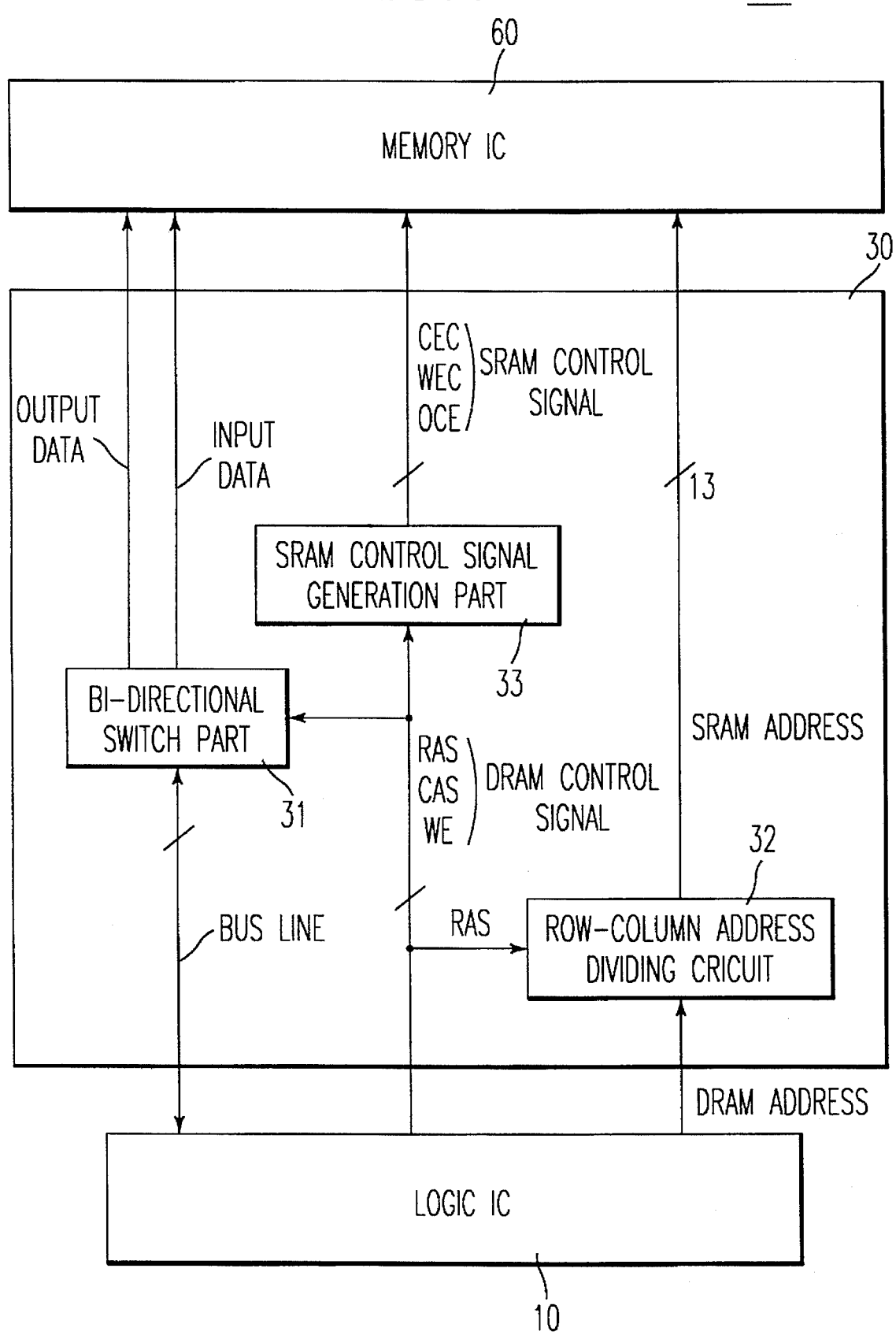
FIG. 1 is a block diagram of a semiconductor memory device according to the present invention.

FIG. 1 is a block diagram for explaining a RAM interface according to a preferred embodiment of the present invention. A semiconductor memory device 200 of FIG. 1 is obtained by modifying the semiconductor memory device 100 of FIG. 16 in which the logic IC 10 and the DRAM memory IC 11 are formed independently of each other. In semiconductor memory device 200, the DRAM memory IC 11 is replaced with an SRAM, and a memory IC (SRAM) 60 is controlled by the logic IC 10 which is designed on the premise that the memory IC 11 is a DRAM. The semiconductor memory device 200 comprises a RAM interface 30 between the logic IC 10 and the memory IC 60.

7. Structure of RAM Interface

Now, a structure of the RAM interface 30 will be described. The RAM interface 30 is comprised of a bi-directional switch circuit 31, a row-column address dividing circuit 32 and an SRAM control signal generation circuit 33. Under the control of the bi-directional switch circuit 31, inputting to and outputting from a data bus are performed in accordance with writing or reading of data. The bi-directional switch circuit 31 is controlled by the WE signal received from the logic IC 10. The row-column address dividing circuit 32 divides a serial address into a row address and a column address using the RAS signal and the CAS signal, respectively, and supplies the row address and the column address to the SRAM. The row-column address dividing circuit 32 is governed by the RAS signal from the logic IC 10. Receiving a DRAM control signal from the logic IC 10, the SRAM control signal generation circuit 33 modifies the DRAM control signal into an SRAM control signal which is necessary to control the SRAM.

7-1. Example of Structure of Bi-Directional Switch Circuit 31

Figure 2:
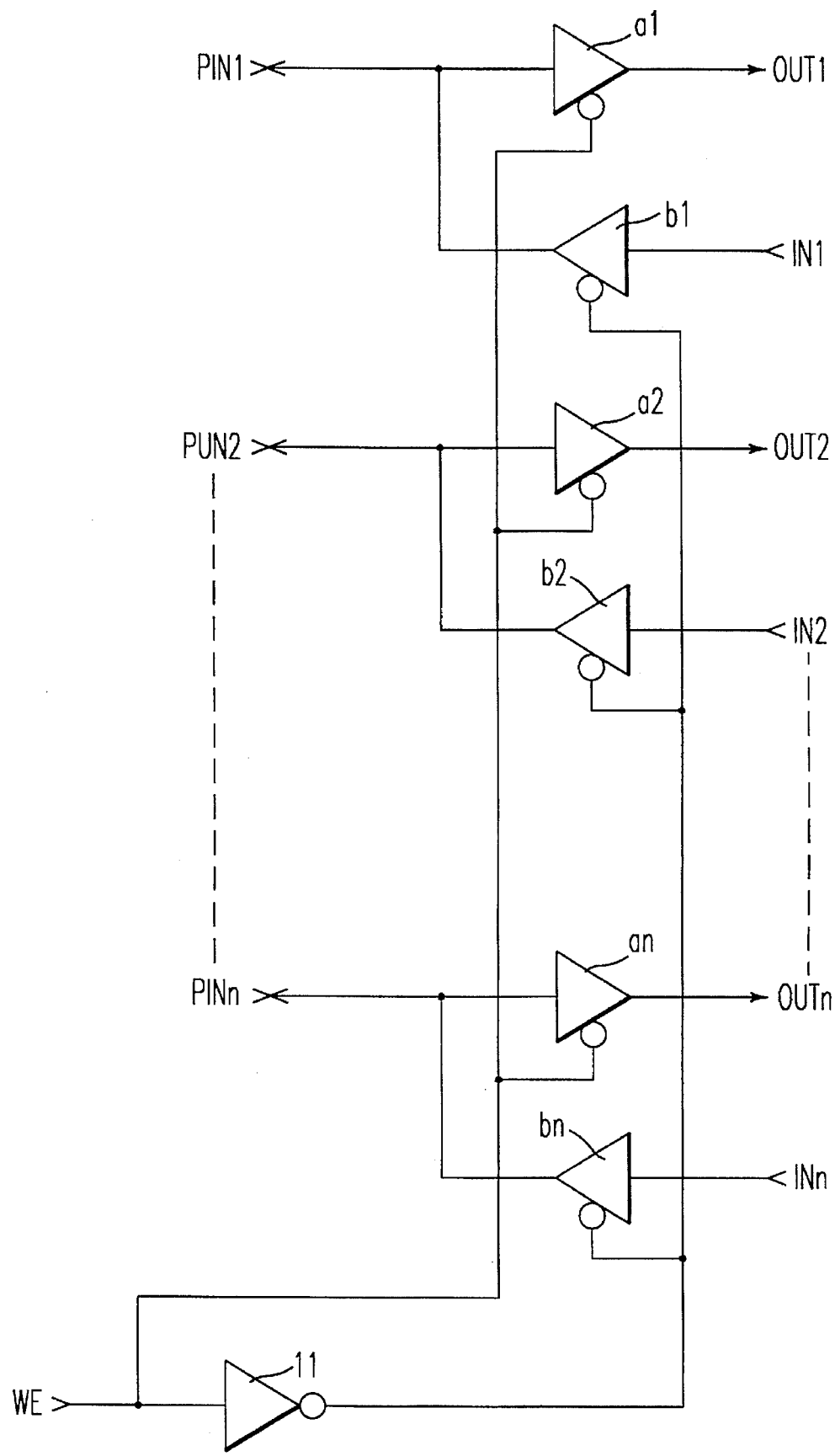
FIG. 2 is a view showing a structure of a bi-directional switch circuit of the semiconductor memory device according to the present invention.

The structures of the respective circuits will be described in the following. FIG. 2 shows an example of a structure of the bi-directional switch circuit 31. In FIG. 2, tri-state buffers a1 to an and b1 to bn are formed respectively for output terminals OUT1 to OUTn and input terminals IN1 to INn of data bus lines PIN1 to PINn. The WE signal is supplied from the logic IC 10 to control the tri-state buffers a1 to an. The WE signal is supplied from the logic 10 through an invertor I1 as a control signal from the tri-state buffers b1 to bn.

Next, operations of the bi-directional switch circuit 31 will be described with reference to the timing chart of FIG. 3. As shown in FIG. 3, since a write mode is invoked while the WE signal from the logic IC 10 is at the low level, the tri-state buffers a1 to an are enabled so that output signals Dout are supplied to the output terminals OUT1 to OUTn from the data bus lines PIN1 to PINn. At this stage, the tri-state buffers b1 to bn are not enabled, and therefore, the input terminals IN1 to INn are at a high impedance state (Hi-Z).

On the other hand, since a read mode is invoked while the WE signal from the logic IC 10 is at the high level, the tri-state buffers b1 to bn are enabled so that input signals Din are supplied to the data bus lines PIN1 to PINn respectively from the input terminals IN1 to INn. Here, since the tri-state buffers a1 to an are not enabled, the output terminals OUT1 to OUTn are at a high impedance state (Hi-Z). Thus, by switching the inputs and the outputs in accordance with whether the WE signal is at the low level or at the high level, the read timing and the write timing as those shown in FIGS. 21 and 22 are attained in the SRAM.

7-2. Example of Structure of Row-Column Address Dividing Circuit 32

FIG. 4 shows an example of a structure of the row-column address dividing circuit 32. In FIG. 4, D-type flip-flops C1 to Cn which operate in response to a trailing edge of the RAS signal are connected to address lines A1 to An, respectively. In general, in a D-type flip-flop, an input supplied to a D-terminal at a rising edge or a trailing edge of a latch signal which is supplied to a T-terminal is stored as an output of a Q-terminal (this behavior is known as triggering), and the output of the Q-terminal will not be changed even if the input to the D-terminal changes until a rising edge or a trailing edge of the next latch signal.

As can be seen in FIG. 4, the address lines A1 to An are connected to the D-terminals of the D-type flip-flops C1 to Cn, respectively. The RAS signal is supplied from the logic IC 10 to the T-terminals of the D-type flip-flops C1 to Cn. Address lines A1' to An' are connected to the Q-terminals of the D-type flip-flops C1 to Cn, respectively. The address lines A1 to An each branch before reaching the relevant D-terminal. These branches are address lines A1" to An" on which original signals are outputted as they are.

Now, operations of the row-column address dividing circuits 32 will be described with reference to FIGS. 5 and 6 which, combined with each other at dotted line A—A, illustrate a timing chart. FIG. 7 shows a structure of FIGS. 5 and 6. In FIGS. 5 and 6, a row-column serial address signal RC consists of a row signal and a column signal which are supplied alternatively and an optional signal which is indicated by the crosshatching. For a convenience sake, the row and the column signals are numbered as a row 1, a column 1, . . . in the order of appearance.

When the row-column serial address signal RC is supplied to the D-terminals of the D-type flip-flops C1 to Cn and the RAS signal is supplied to the T-terminals, the state of the row-column serial address signal RC at a trailing edge of the RAS signal is stored. Until a trailing edge of the next RAS signal, the Q-terminals keep outputting the row-column serial address signal RC of such a state. Returning again to FIG. 5, at a trailing edge of the first RAS signal which is supplied to the T-terminals, the row-column serial address signal RC still remains as the row 1 signal. Hence, the row 1 signal is outputted from the Q-terminals. This continues until a trailing edge of the next RAS signal. At the trailing edge of the next RAS signal, the row-column serial address signal RC stays as the row 2 signal so that the row 2 signal is outputted from the Q-terminals. Thus, by triggering at timings of the row address signals which constitute the row-column serial address signal RC, only the row address signals are outputted from the address lines A1' to An'.

With respect to the column address signal, on the other hand, it is not necessary to output the column address signal alone using the D-type flip-flops. Through the address lines A1' to An', the row-column serial address signal RC as it presently is is supplied to the memory IC 60. The row-column serial address signal RC is triggered at a trailing edge of the CAS signal, whereby the column address is designated in the memory IC 60. The extracted row address signal is triggered at a trailing edge of the CAS signal in the memory IC 60 so that the row address is finally designated.

In this case, the CAS signal corresponds to the CE signal of FIGS. 21 and 22. Therefore, the read and the write operation timings as those shown in FIGS. 21 and 22 are attained in the SRAM.

7-3. Example of Structure of SRAM Control Signal Generation Circuit 33

As an example of a structure of the SRAM control signal generation circuit 33, FIG. 8 sows an SRAM control signal generation circuit 33a which is suitable for an early write cycle. In FIG. 8, the SRAM control signal generation circuit 33a comprises an invertor I2 for inverting the CAS signal, a CAS signal latch circuit E which is formed by a D-type flip-flop which outputs an inverted signal received from the invertor I2 after a certain delay time in accordance with a clock signal CLK, and an OR circuit F which performs OR operations in accordance with a signal from the CAS signal latch circuit E and the WE signal. As shown in FIG. 8, the CAS signal latch circuit E receives the inverted signal of the invertor I2 at its D-terminal. At its T-terminal, the CAS signal latch circuit E receives the clock signal CLK. The clock signal CLK as herein termed refers to a master clock which is used for overall control of the system.

Figure 9:
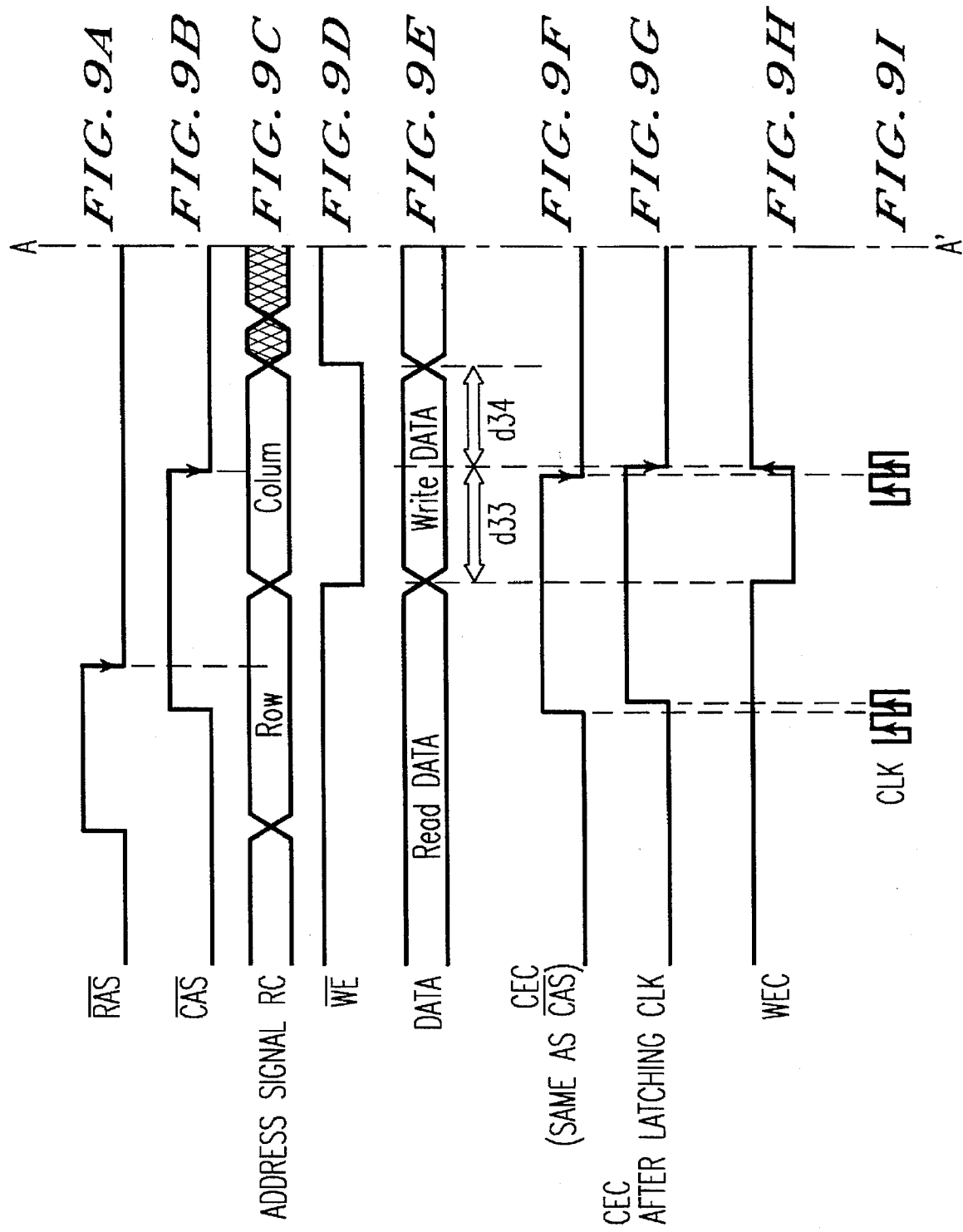
FIGS. 9 and 10 are divided timing charts showing operations of the SRAM control signal generation circuit for an early write cycle.
Figure 10:
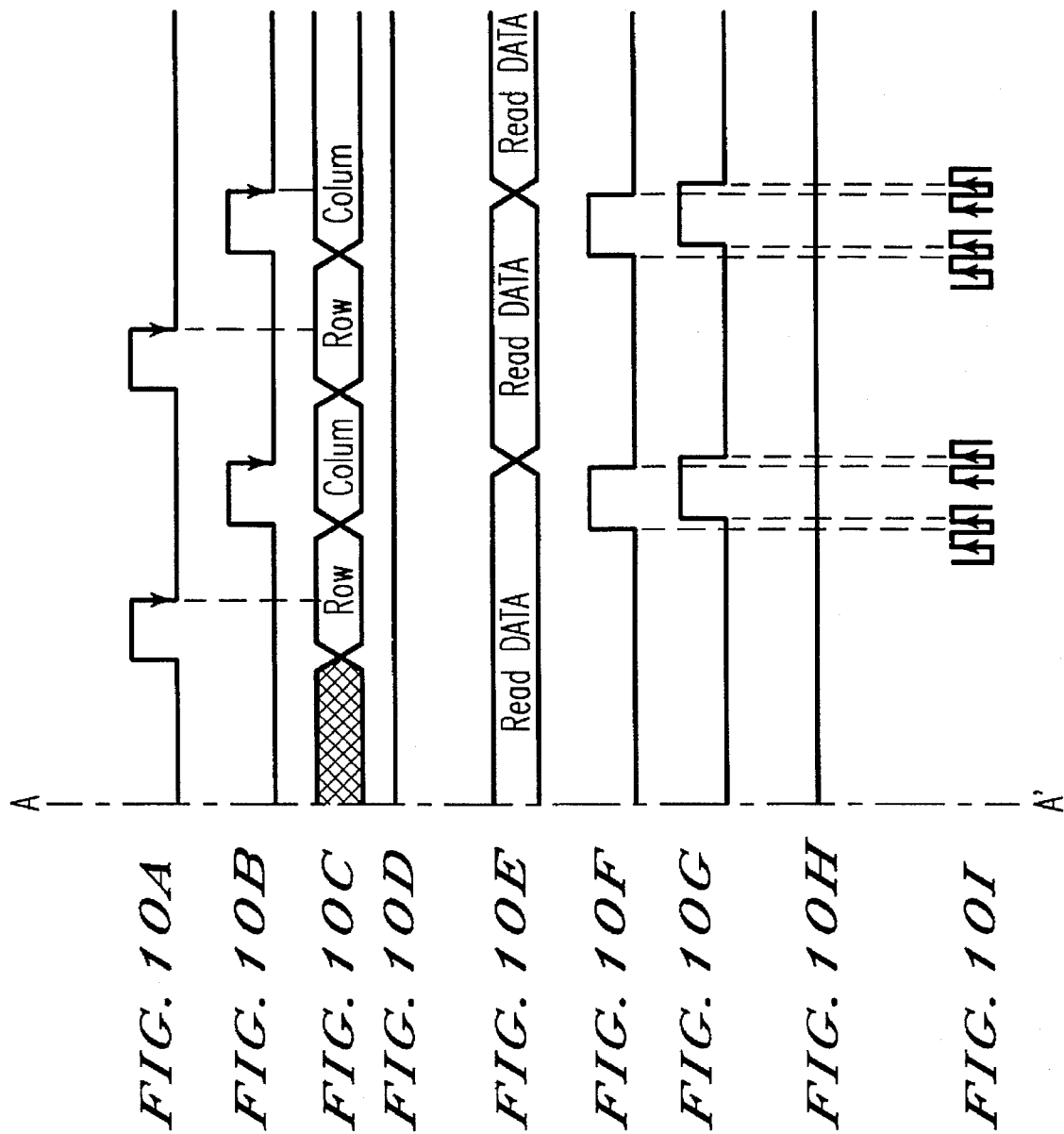

Next, operations of the SRAM control signal generation circuit 33a will be described with reference to FIGS. 9 and 10 which, combined with each other at dotted line A—A, illustrated a timing chart. FIG. 11 shows a structure of FIGS. 9 and 10. Basically, since it is only necessary to supply a rising edge of a WEC signal, or a latch signal for writing SRAM data, in such a manner that data is written while the WE signal stays at the low level, only the inverted signal of the CAS signal and the WE signal are necessary for the OR operations. However, this is not sufficient in that designation of an address by the CAS signal could take place concurrently with fixing of written data by the WEC signal (that is, d35 of FIG. 22 could be 0). Since data will not be written if this happens, writing of the data must be performed after a certain time from designation of the address. This is why the CAS signal latch circuit E is disposed between the invertor I2 and the OR circuit F.

The CAS signal latch circuit E receives an inverted signal of a CEC signal (which is the same as the CAS signal but is to be referred to as such for discrimination from the CAS signal) from the invertor I2 at its D-terminal. At its T-terminal, the CAS signal latch circuit E receives the clock signal CLK. AT a time when a rising pulse of the clock signal CLK is supplied to the CAS signal latch circuit E, the inverted signal of the CAS signal is at the high level. Since the inverted signal of the CAS signal is at the low level at a rising pulse of the next clock signal CLK, the CEC signal after the clock CLK is latched is shifted from the clock signal CLK by half the cycle. Hence, by supplying the CEC signal after latching of the clock CLK and the WE signal to the OR circuit F, it is possible to supply the WEC signal, or the latch signal for writing SRAM data, from the OR circuit F during the low-level period of the WE signal.

A shift of the CEC signal after the clock CLK is latched is determined so as to satisfy the relation between the time d32 and the time d35 of FIG. 22.

As described above, the SRAM control signal generation circuit 33a, the bi-directional switch circuit 31 and the row-column address dividing circuit 32 having such structures constitute a RAM interface circuit for an early write cycle.

7-4. Other Examples of SRAM Control Signal Generation Circuit 33

FIG. 12 shows an SRAM control signal generation circuit 33b which deals with a delayed write cycle, as one of other examples of the SRAM control signal generation circuit 33. In FIG. 12, the SRAM control signal generation circuit 33b comprises a WE signal latch circuit H which is formed by a D-type flip-flop which delays the WE signal for a certain delay time and outputs the WE signal in response to a frequency-divided signal CLKS of the clock signal CLK, a clock frequency-division circuit G which generates the frequency-divided signal CLKS of the clock signal CLK which is used to govern the system as a whole, and an OR circuit J which performs negative logic OR operations in accordance with a QC signal which is received from a QC-terminal of the D-type flip-flop H and the WE signal.

The clock frequency-division circuit G of FIG. 12 is formed by one D-type flip-flop which has a QC-terminal and a D-terminal connected to each other. From a Q-terminal, the clock frequency-division circuit G outputs a signal which is shifted from the clock signal CLK by one cycle as the frequency-divided signal CLKS.

Next, operations of the SRAM control signal generation circuit 33 will be described with reference to FIGS. 13 and 14 which, combined with each other at dotted line A—A, illustrate a timing chart. FIG. 15 shows a structure of FIGS. 13 and 14. Similarly to an early write cycle, a rising edge of the WEC signal for writing of SRAM data must be supplied in a delayed write cycle as well. However, in a delayed write cycle, there is no latch signal which has an appropriate timing as the CAS signal which is used in an early write cycle. Hence, by latching WE signal by the frequency-divided signal CLKS in the WE signal latch circuit H to generate the QC signal which is outputted after a certain delayed time and thereby performing the OR operations by the WE signal and the QC signal in the OR circuit J, a rising edge of the WEC signal is generated.

Referring again to FIGS. 13 and 14, when the WE signal at the low level is supplied to the D-terminal of the D-type flip-flop H, the WE signal latch circuit H delays the WE signal for a certain delay time in accordance with the frequency-divided signal CLKS which is generated by the divider G, and outputs the delayed signal from the QC-terminal as an inverted signal. The output signal from the QC-terminal and the WE signal are supplied to the OR circuit J which performs negative logic OR operations so that the WEC signal, or a latch signal for writing SRAM data, is supplied during the low level period of the WE signal.

Figure 13:
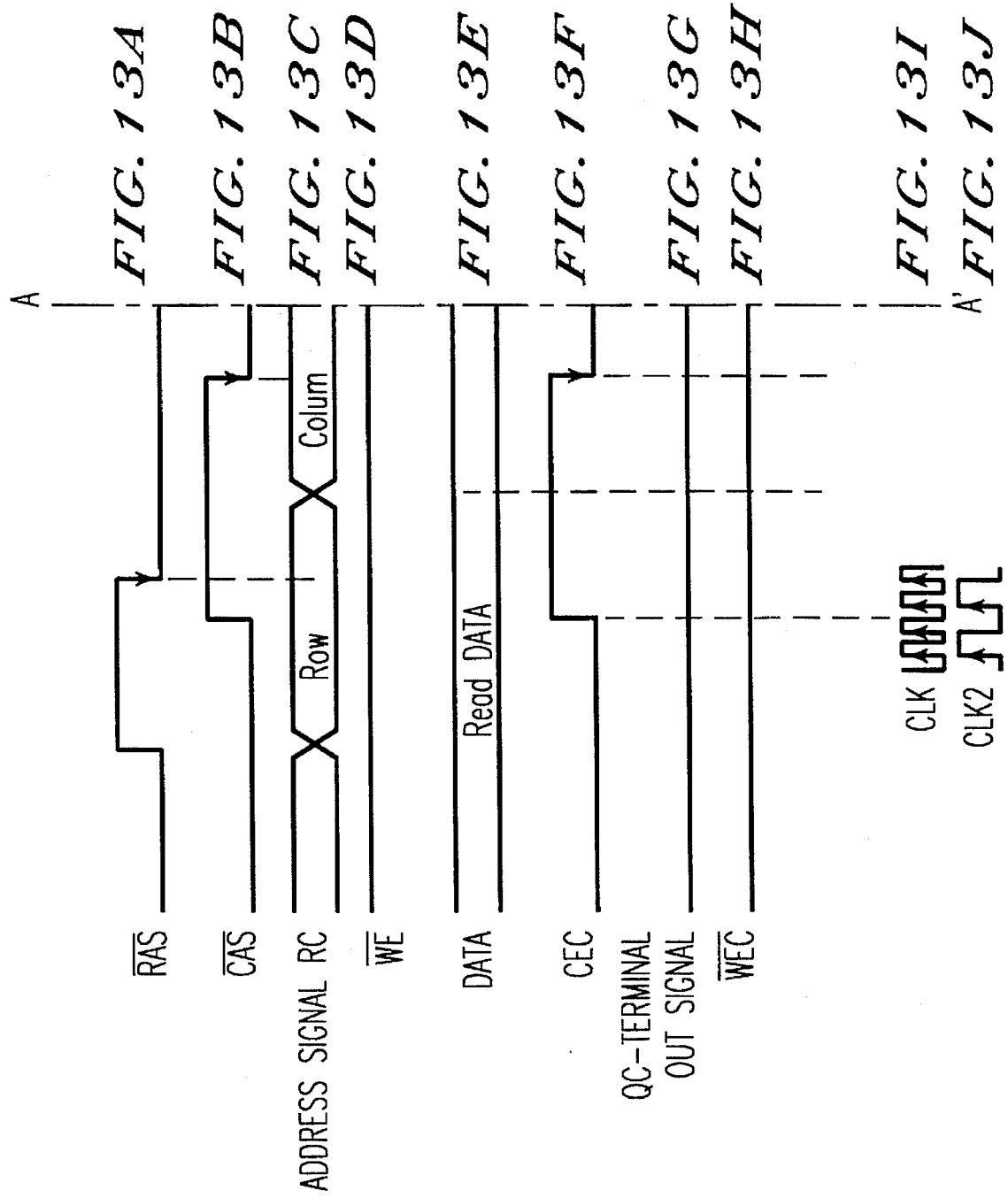
FIGS. 13 and 14 are divided timing charts showing operations of the SRAM control signal generation circuit for a delayed write cycle.
Figure 14:
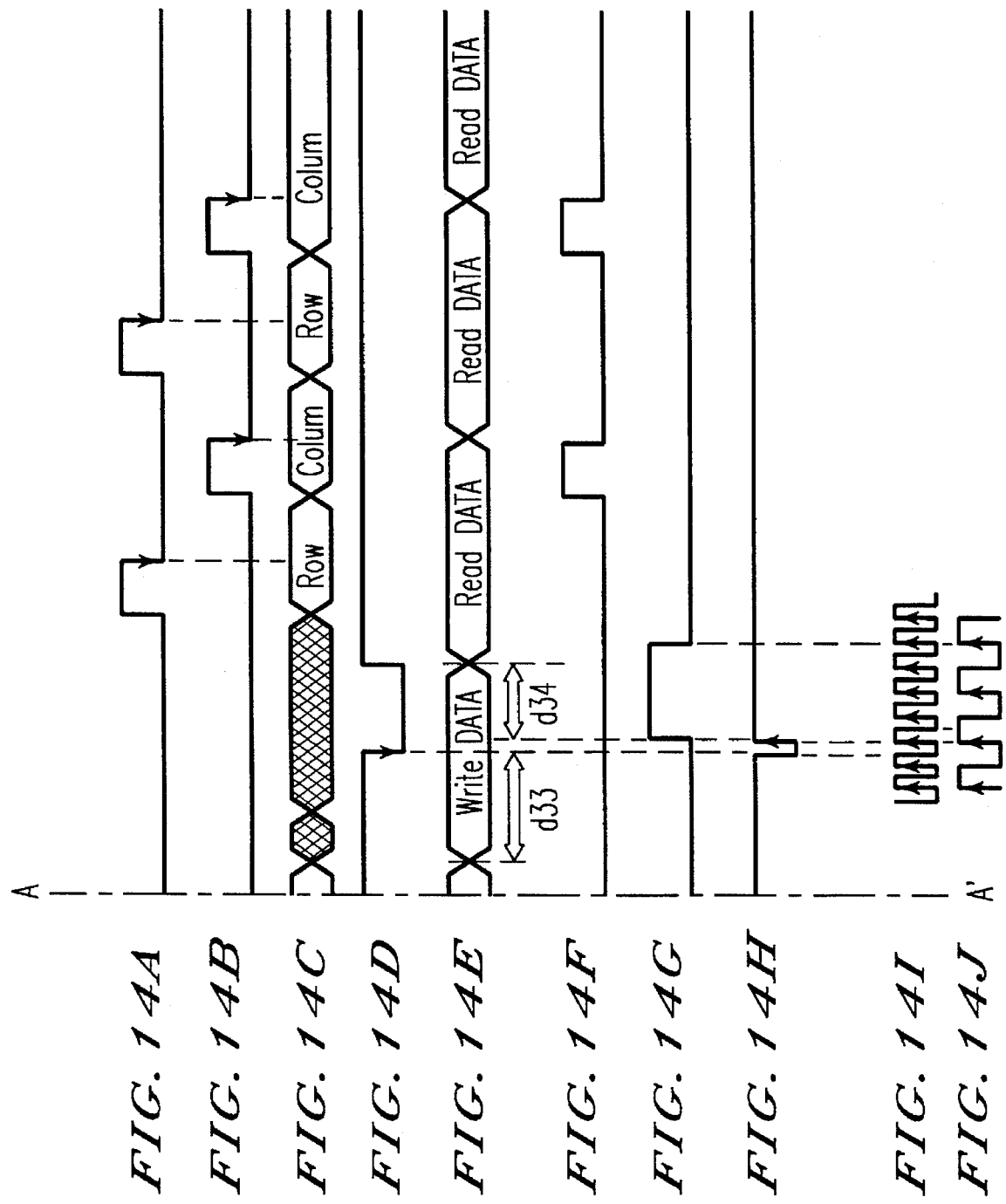
Figure 23:
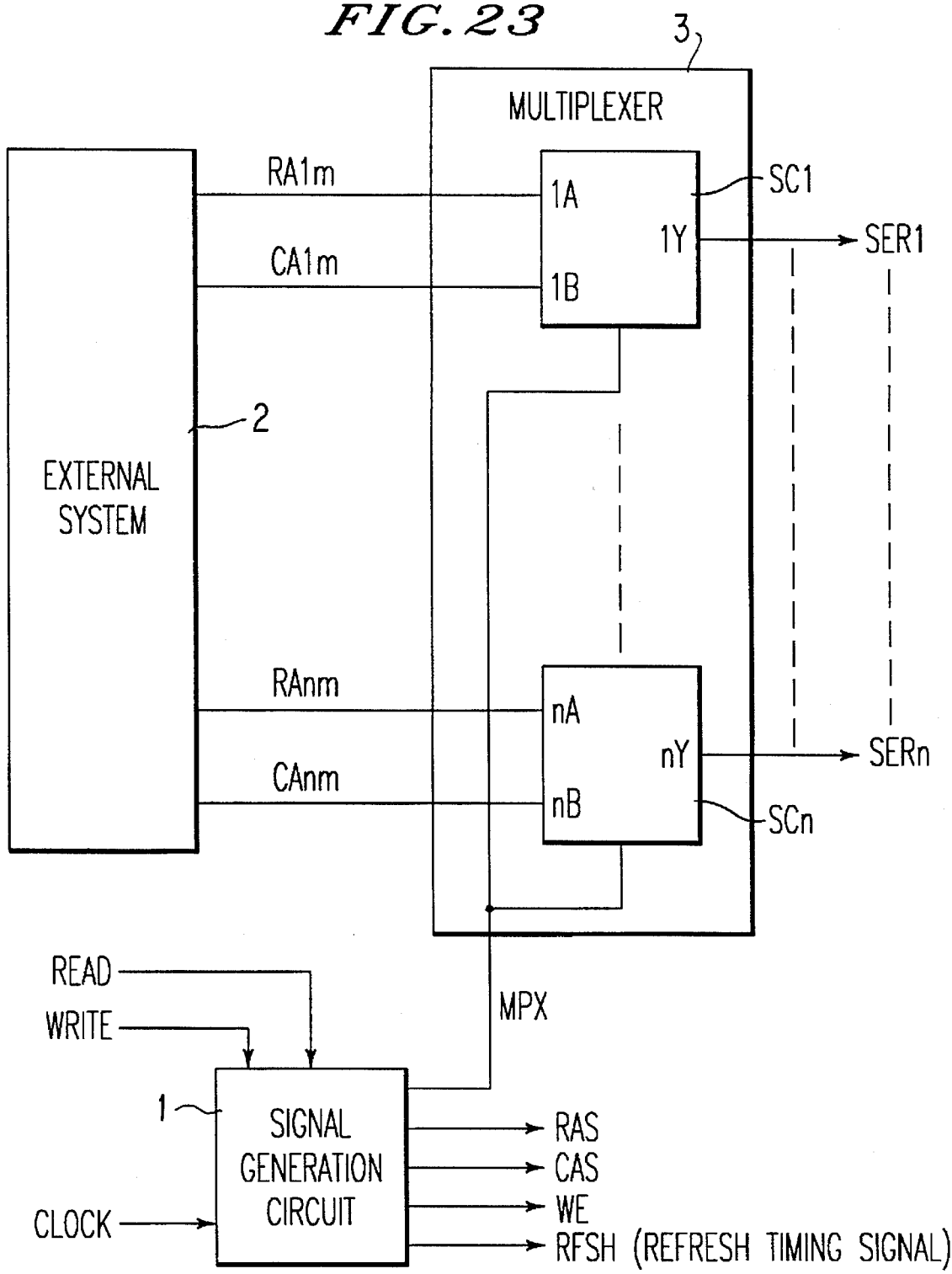
FIG. 23 is a block diagram showing a structure of a multiplexer for an address signal and a surrounding structure.
Figure 25A:
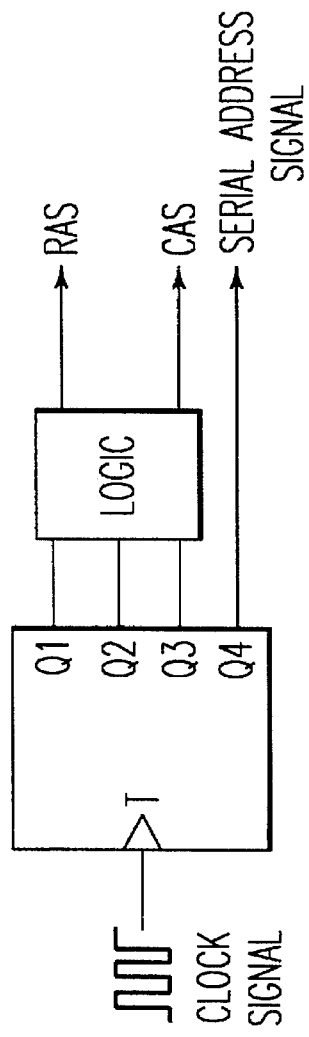
FIG. 25 is a block diagram showing a structure in which addresses are converted into serial form without using a multiplexer.
Figure 25B:
Figure 25C:
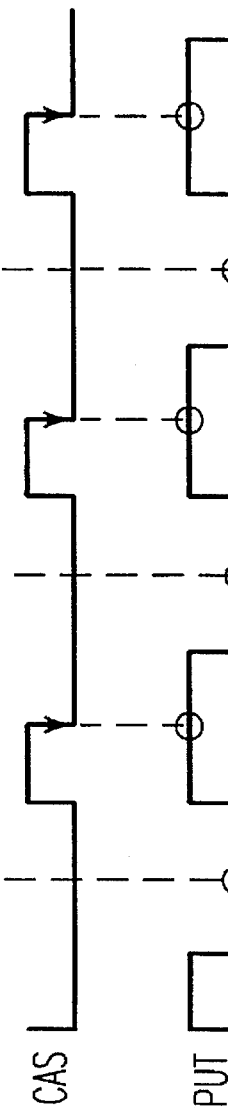
Figure 25D:

The frequency-divided signal CLKS is generated by frequency-dividing the clock signal CLK once by the divider G in FIGS. 13 and 14. However, as far as the relation between the time d32 and the time d35 of FIG. 22 is satisfied, the clock signal CLK may be frequency-divided for more times to generate the frequency-divided signal CLKS.

A RAM interface circuit for a delayed write cycle is formed by the SRAM control signal generation circuit 33b, the bi-directional switch circuit 31 and the row-column address dividing circuit 32 having such structures.

While the invention has been described in detail, the foregoing description is in all aspects illustrative and not restrictive. It is understood that numerous other modifications and variations can be devised without departing from the scope of the invention.

I claim:

1. A RAM interface for receiving a control signal which controls a DRAM from a DRAM control device and applying the control signal to control a SRAM, comprising:

an address signal dividing means for dividing a serial row-column address signal from said DRAM control device into a row address signal and a column address signal wherein said address signal dividing means includes address signal latching means, a number of said address signal latching means being a same as a number of address lines, and wherein said address signal latching means receive said serial row-column address signal and a RAS signal which instructs to fetch a row address signal, latch and output said row address signal at timing of said RAS signal while simultaneously outputting said serial row-column address signal as it presently is; and a static RAM control signal generating means for receiving said control signal to generate a control signal which controls said SRAM, wherein said static RAM control signal generating means includes a delay circuit for controlling a timing of outputting said control signal.

2. The RAM interface of claim 1, further comprising bidirectional switching means which controls inputting and outputting of a data signal for each data bus line in accordance with writing and reading of data.

3. The RAM interface of claim 2, wherein said bidirectional switching means includes first and second tri-state buffers which operate in response to a WE signal which instructs to write data in or read data from said DRAM, wherein said first tri-state buffer is activated for writing of data but stays at a high impedance state when data is to be read, and wherein said second tri-state buffer is activated for reading of data but stays at a high impedance state when data is to be written.

4. The RAM interface of claim 1, wherein said address signal latching means each include a D-type latch.

5. The RAM interface of claim 1, wherein said static RAM control signal generating means includes a WEC signal generating means which generates a WEC signal which instructs to start writing of data, wherein said WEC signal generating means includes CAS signal latching means, said CAS signal latching means receives an inverted signal of a CAS signal which instructs to fetch a column address signal and a clock signal which is supplied at prescribed intervals, said CAS signal latching means then delays said CAS signal on the basis of a timing of said clock signal and outputs it as an inverted delay CAS signal, and wherein said WEC signal generating means also includes an OR circuit, said OR circuit receives a WE signal which instructs to read data and said inverted delay CAS signal and there outputs a signal which is generated by OR operations as said WEC signal.

6. The semiconductor memory device of claim 5, wherein said CAS signal latching means includes a D-type latch.

7. The RAM interface of claim 1, wherein said static RAM control signal generating means further includes a WEC signal generating means which generates a WEC signal which instructs to start writing of data.

wherein said WEC signal generating means includes clock frequency-dividing means which frequency-divides a clock signal which is supplied at regular intervals, and outputs a frequency-divided clock signal, wherein said WEC signal generating means also includes WE signal latching means, said WE signal latching means receives a WE signal which instructs to read data and said frequency-divided clock signal, said WE signal latching means then delays said WE signal for a predetermined delay time on the basis of a timing of said frequency-divided clock signal and outputs it as an inverted WE delay signal, and wherein said WEC signal generating means also includes an OR circuit, said OR circuit receives said inverted WE delay signal and said WE signal and outputs a signal which is generated by OR operations as said WEC signal.

8. The semiconductor memory device of claim 7, wherein said WE signal latching means and said clock frequency-dividing-means each include a D-type latch.

* * * * *